(12) United States Patent
Vice

(10) Patent No.: US 7,616,045 B2
(45) Date of Patent: Nov. 10, 2009

(54) MIXER WITH BALANCED LOCAL OSCILLATOR SIGNAL

(75) Inventor: Michael Wendell Vice, El Granada, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/019,100

(22) Filed: Jan. 24, 2008

(65) Prior Publication Data

US 2009/0189673 A1 Jul. 30, 2009

(51) Int. Cl.
*H04B 1/26* (2006.01)
(52) U.S. Cl. .................. 327/359; 327/355; 455/326
(58) Field of Classification Search ......... 327/355–361; 455/326, 333
See application file for complete search history.

(56) References Cited

U.S. PATENT DOCUMENTS

| | | | | | |
|---|---|---|---|---|---|
| 4,675,911 | A | * | 6/1987 | Sokolov et al. | 455/325 |
| 5,039,891 | A | * | 8/1991 | Wen et al. | 327/113 |
| 5,678,225 | A | * | 10/1997 | Kobayashi | 455/330 |
| 5,799,248 | A | * | 8/1998 | Vice | 455/333 |
| 6,064,872 | A | * | 5/2000 | Vice | 455/326 |
| 6,892,062 | B2 | * | 5/2005 | Lee et al. | 455/326 |

* cited by examiner

*Primary Examiner*—Dinh T. Le

(57) ABSTRACT

A mixer includes a first field effect transistor (FET) having a gate that receives a first signal of a balanced local oscillator (LO) signal, a first source/drain coupled to a ground voltage, and a second source/drain; and a second FET having a gate that receives a second signal of the balanced LO signal, a first source/drain that floats, and a second source/drain connected to the second source/drain of the first FET to form a mixing node, the second signal being out of phase with the first signal. A diplexer is connected between the mixing node and each of a radio frequency (RF) port and an intermediate frequency (IF) port. A first LO leakage caused by the first FET is substantially canceled by a second LO leakage caused by the second FET at the mixing node.

19 Claims, 3 Drawing Sheets

100

200

300

400

MIXER WITH BALANCED LOCAL OSCILLATOR SIGNAL

BACKGROUND

Frequency mixers may be included in many types of electronic systems. For example, frequency mixers in radio systems down convert a received radio frequency (RF) signal by combing the RF signal with a local oscillator (LO) signal. The combination of the RF signal and the LO signal yields an intermediate frequency (IF) signal, which has a frequency corresponding to a difference between the RF and LO signals.

FIG. 1 is a block diagram of a known mixer 100, which includes LO-port 110 for inputting a LO signal, RF-port 120 for inputting a received RF signal and IF-port 130 for outputting an IF signal. The mixer 100 also includes a single grounded-source field effect transistor (FET) 112, which may be a gallium arsenide field-effect transistor (GaAsFET), for example. FET 112 includes a gate connected to LO-port 110 for receiving the LO signal and a source connected to ground.

The mixer 100 also incorporates a diplexer 115, which performs frequency separation to enable RF and IF signals to be received and sent on different frequencies. The diplexer includes capacitor C1 connected to RF-port 120 and inductor L1 connected to IF-port 130. The mixer 100 is generally capable of low conversion loss and a low noise figure over its frequency range, and requires little LO drive power. Isolation of LO-port 110 is provided by the mixing FET 112. However, FET 112 leaks LO energy at frequencies where parasitic capacitance between the gate and drain (Cgd) of FET 112 is significant. The LO-port isolation may therefore not be sufficient for system requirements.

Efforts to improve LO-port isolation (and to reduce LO energy leakage) have included the addition of baluns, which isolate a single, unbalanced input line and provide a corresponding balanced output, consisting of two output lines carrying out of phase signals. For example, FIG. 2 is a block diagram of conventional mixer 200, which includes balun 216 on LO-port 110 and balun 218 on IF-port 130. FIG. 3 is a block diagram of another conventional mixer 300, which includes balun 316 on RF-port 120 and balun 318 on IF-port 130. For each balun, an unbalanced signal is carried on two signal lines, one of which is tied to ground, and the balanced signal may be carried on three signal lines, one of which is tied to ground via a center tap (not shown) and the remaining two of which carry electrical signals having equal amplitudes, but opposite phases.

Although LO-port isolation may be improved by the configurations of mixers 200 and 300, the baluns 216, 218 or the baluns 316, 318 respectively increase cost and size of the circuit, and cause additional loss. Further, when balun 316 is used on RF-port 120, the noise figure degrades in a down converter application. Therefore, balun 316 usually must be realized as a passive structure, in an attempt to minimize impact on the noise figure. Also, when balun 316 is used on RF-port 120 or balun 218 and/or 318 is used on IF-port 130, conversion loss is elevated. For example, with respect to IF-port 130, the low frequencies usually require that baluns 218, 318 be realized as coil-core transformers, which are typically relatively large and expensive.

SUMMARY

In a representative embodiment, a mixer includes a first transistor and a second transistor. The first transistor includes a gate operative to receive a first signal of a balanced local oscillator (LO) signal, a first source/drain coupled to ground, and a second source/drain. The second transistor includes a gate operative to receive a second signal of the balanced LO signal, a first source/drain that is floating, and a second source/drain connected to the second source/drain of the first transistor. Leakage of LO energy from the second transistor substantially cancels leakage of LO energy from the first transistor.

In another representative embodiment, a mixer includes a balun connected to a local oscillator (LO) port of the mixer. The mixer also includes a first transistor comprising a first gate coupled to a first output of the balun and a first source coupled to a ground voltage; and a second transistor comprising a second gate coupled to a second output of the balun and a floating second source operative to increase isolation of the LO-port to a diplexer of the mixer.

In another representative embodiment, a mixer includes a first field effect transistor (FET) having a first gate that receives a first signal of a balanced local, oscillator (LO) signal, a first source coupled to a ground voltage, and a first drain. The mixer further includes a second FET having a second gate that receives a second signal of the balanced LO signal, a second source that floats, and a second drain connected to the first drain to form a mixing node. The second signal has a phase opposite to a phase of the first signal. A diplexer is connected between the mixing node and each of an RF-port and an IF-port. A first LO leakage caused by the first FET is substantially canceled by a second LO leakage caused by the second FET at the mixing node.

BRIEF DESCRIPTION OF THE DRAWINGS

The example embodiments are best understood from the following detailed description when read with the accompanying figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

Figure 4:
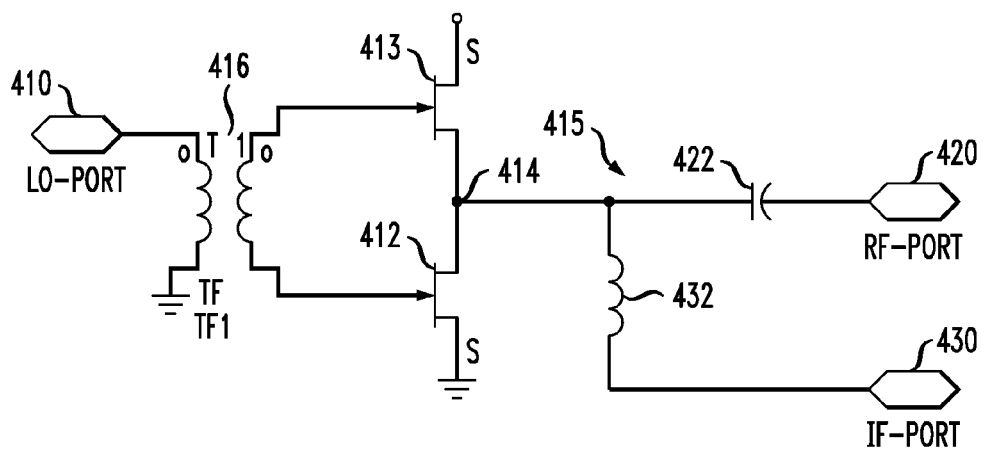
FIG. 4 is a block diagram illustrating a mixer according to a representative embodiment.

FIG. 4 is a block diagram illustrating a mixer, according to a representative embodiment. A mixer 400 includes a mixing transistor, FET 412, and a companion transistor to the mixing transistor, FET 413. Both FET 412 and FET 413 may be GaAs FET transistors, for example, although other types of FETs (and/or other types of transistors) within the purview of one of ordinary skill in the art may be incorporated into mixer 400, without departing from the spirit and scope of the present teachings. For example, the mixing transistor and the companion transistor may be high electron mobility transistors (HEMTs), pseudomorphic HEMTs, heterostructure FETs (HFETs), etc.

Also, FET 412 and FET 413 may vary in size, indicated for example by total gate width, although the particular size of each transistor may be adjusted to provide unique benefits for any particular situation or to meet various design requirements. For example, in an illustrative embodiment, FET 412 may be 60 µm in total gate width and FET 413 may be 24 µm in total gate width.

Gates of FET 412 and FET 413 are respectively connected to receive balanced signals based on an LO signal input through LO-port 410. The balanced signals received by FETs 412, 413 may have the same amplitudes, but different phases. For example, the signal input to the gate of FET 413 may be 180 degrees out of phase with the signal input to the gate of FET 412. The LO signal from LO-port 410 may be naturally balanced, in which case the already balanced LO signal(s) may be directly input to the gates of FETs 412, 413, respectively. However, the LO signal from LO-port 410 is usually an unbalanced signal, in which case the LO signal must be subjected to a balance function to generate the balanced signals input to the gates of FETs 412, 413.

In various embodiments, the balanced signals may be provided by any component capable of generating or producing them. In the depicted representative embodiment, the gates of FETs 412, 413 are connected to first and second output lines of balun 416, to receive the balanced LO drive signals. A third line or center tap (not shown) of balun 416 may be connected to ground. A first input line of balun 416 is connected to LO-port 410 for receiving the unbalanced LO signal, and the second input line of the balun 416 is connected to ground.

Alternatively, balun 416 may provide the balanced signals with no grounded center tap, in which case balun 416 simply acts as a differential circuit, having a virtual point of balance. In other embodiments, any similar component that provides an appropriate balance function may be substituted for balun 416. Also, as stated above, if the LO-port 410 generates a naturally balanced signal, there is no need for balun 416 or other component to perform the balance function.

Balun 416 may be realized as a transformer, for example, and is represented as a transformer in FIG. 4, for convenience of explanation. Because LO-port 410 does not substantially impact conversion loss or noise figure, balun 416 may be a small, relatively inexpensive balun. The size of balun 416 depends, for example, on the frequency of operation of the mixer 400. Also, balun 416 may be implemented as a stand-alone component, inserted between the LO-port 410 and the gates of FETs 412, 413, thus being easily and inexpensively incorporated into the functionality of mixer 400. The circuit of mixer 400 benefits from the gain of the active balun 416, which effectively helps reduce the LO drive requirement of the mixer 400.

FIG. 4 depicts a drain of FET 412 connected to a drain of FET 413, forming mixing node 414 in which the LO signal received through LO-port 410 is mixed with an RF signal received through RF-port 420. A source of FET 412 is shown connected to ground. However, a source of FET 413 is not grounded, allowing it to float, thus creating a single-ended mixing structure. Accordingly, FET 413 does not substantively contribute to the actual mixing operation. However, FET 413 does introduce LO leakage into the mixing node 414.

It is understood that the terminals of FETs 412, 413 are designated sources and drains in FIG. 4 for convenience of explanation. As such, in various embodiments, the sources and drains may be reversed, without departing from the spirit and scope of the present teachings. For example, FET 413 may have a floating drain, as opposed to a floating source, and the mixing node 414 may be formed by connected sources of FET 412 and 413.

Since the gate of FET 413 is driven by a signal that is out of phase with the signal driving the gate of FET 412, the leakage from FET 413 tends to cancel the leakage from FET 412 at the mixing node 414. The scope of leakage cancellation depends, in part, on the relative sizes of FET 412 and FET 413, which may be selected such that the amplitude of leakage can be matched between FET 412 and FET 413 to reduce or eliminate the LO-port leakage of the mixer 400. For example, as stated above, FET 412 may be substantially larger than FET 413, e.g., FET 412 may be 60 um and FET 413 may be 24 um in an illustrative embodiment.

The mixing node 114 is connected to diplexer 415, which connects the mixing node 114 with RF-port 420 and IF-port 430, for outputting the intermediate frequency based on mixing the LO signal and the RF signal. For example, the diplexer 415 includes capacitor 422 connected to RF-port 120 and inductor 432 connected to IF-port 130. The diplexer 415 performs frequency separation to enable RF and IF signals to be received and sent on different frequencies. Various realizations of the diplexer 415 may be included in mixer 400 without affecting the spirit and scope of the description. For example, the values of the capacitor 422 and the inductor 432 may be determined in a known manner in accordance with the specific RF and IF frequencies involved in the mixing operation. Also, the inductor 432 may have a specified quality factor (INDQ), for example, given at a specified frequency.

The diplexer 415 may also be realized by a network of arbitrary complexity for the purpose of enhancing the selectivity of the diplexer and enabling the passage of RF and IF signals of arbitrarily close frequency proximity. The diplexer 415 may also be realized as a directional coupler or circulator. For example, the RF and IF signals propagate in opposite directions to each other in that the RF input signal travels toward the mixing node 414 whereas the IF output signal travels away from the mixing node 414. As such, the RF and IF signals are amenable to separation by apparatuses that separate forward and reverse traveling waves, such as directional couplers and circulators.

Accordingly, mixer 400 receives an LO signal through LO-port 410, which is to be mixed with an RF signal received through RF-port 420 to output a desired IF signal through IF-port 430. A balance function is performed on the received LO signal (assuming the LO signal is initially unbalanced), such that balanced, out of phase LO signals are input to the gates of FET 412 and FET 413, respectively. Corresponding LO energy leaks into the mixing node 114 from both FET 412 and FET 413. However, because the balanced input signals are out of phase, the leakage from FET 413 substantially cancels the leakage from FET 412. This cancellation, in turn, reduces LO energy leakage from RF-port 420 and improves isolation of LO-port 410 from RF-port 420.

Figure 1:
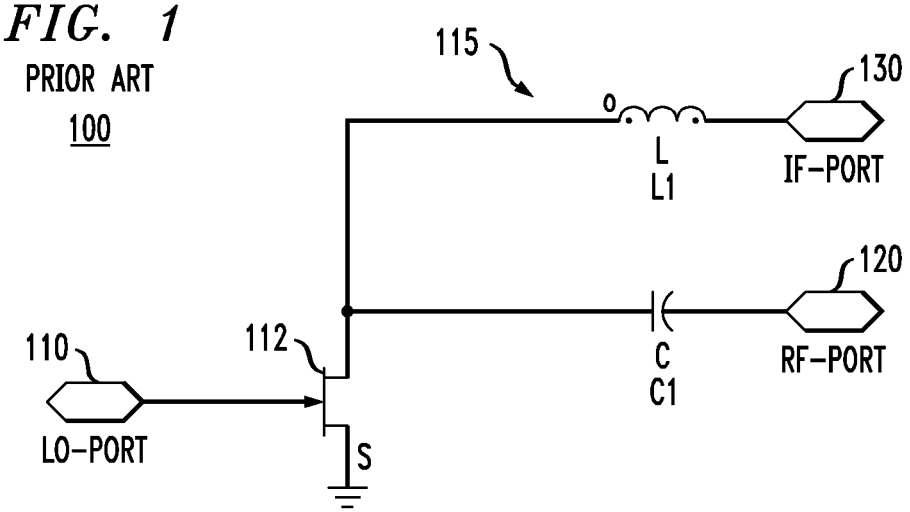
FIG. 1 is a block diagram illustrating a conventional mixer.
Figure 2:
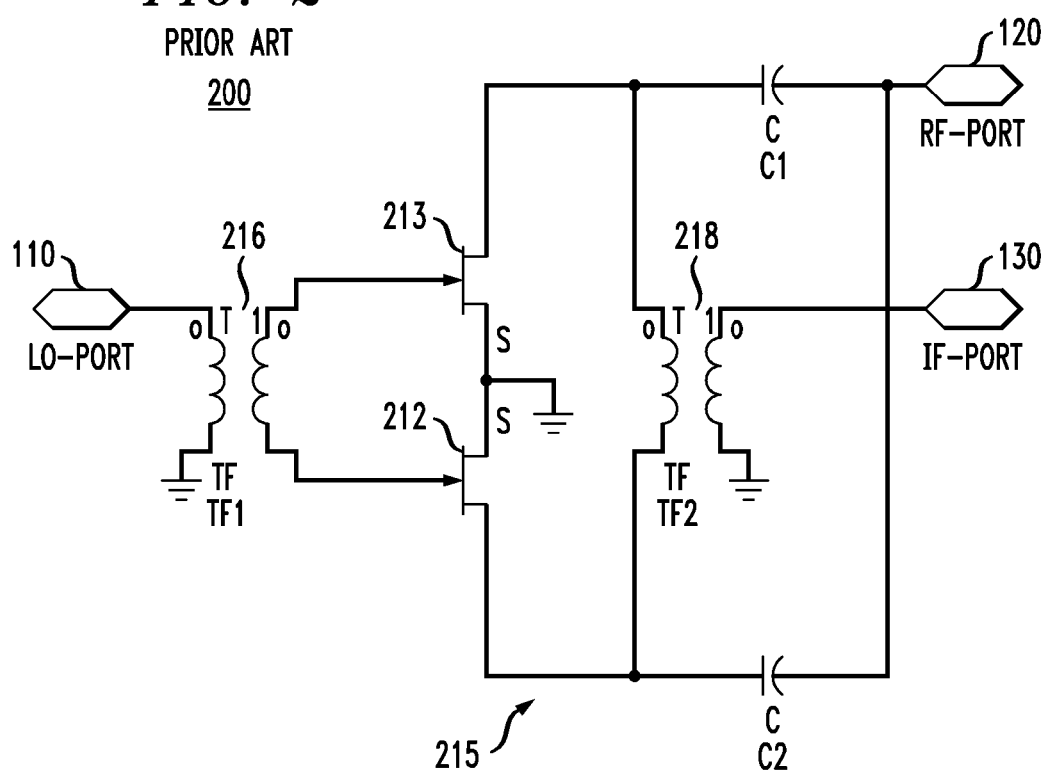
FIG. 2 is a block diagram illustrating a conventional mixer.
Figure 3:
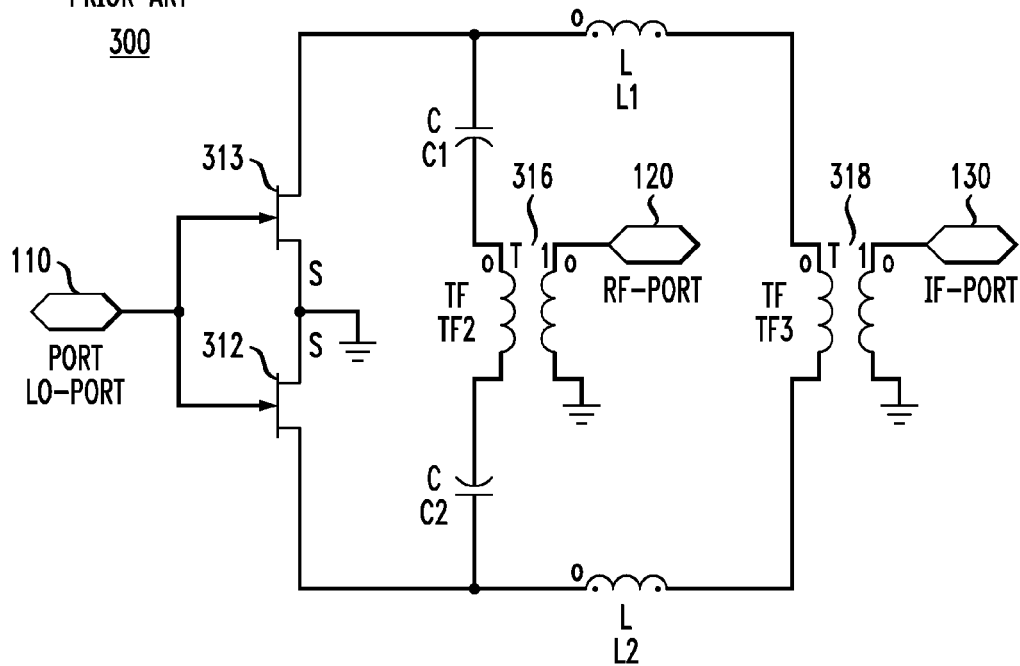
FIG. 3 is a block diagram illustrating a conventional mixer.
Figure 5:
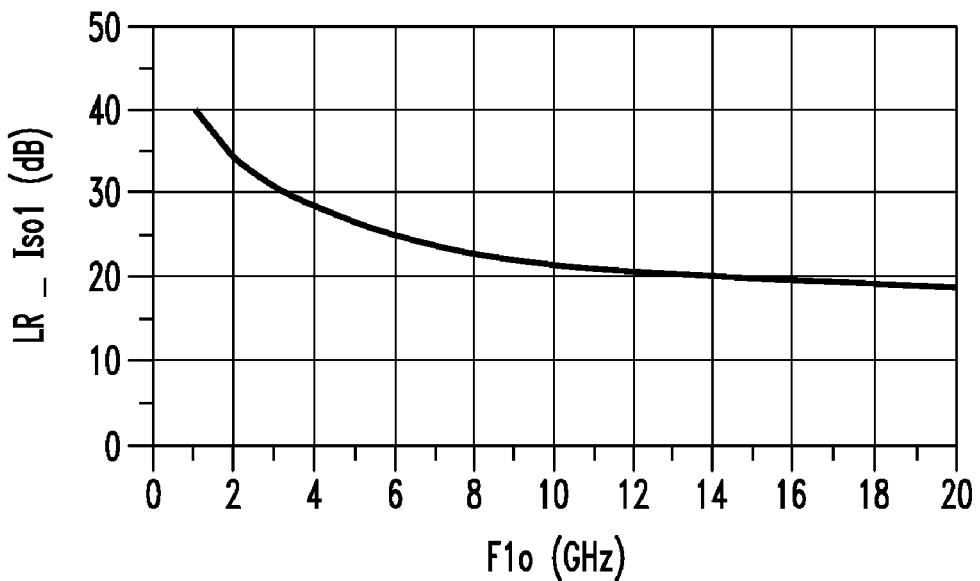
FIG. 5 is a graph illustrating energy loss characteristics of a conventional mixer.

For comparison purposes, FIG. 5 provides a graph illustrating energy lost in a conventional mixer from an RF-port due to LO leakage in the mixing node. For example, FIG. 5 may indicate energy lost from the conventional mixer 100 depicted FIG. 1. The vertical axis of FIG. 5 shows LO to RF isolation, which indicates isolation of the LO-port (e.g., LO-port 110) from the RF-port (RF-port 120), in decibels (dB). The horizontal axis shows frequency of the LO signal input through the LO-port in Gigahertz (GHz).

The curve of FIG. 5 shows a substantial loss of LO energy (through the RF-port) as the frequency of the LO signal increases. For example when the frequency of the LO signal is 13 GHz, the energy output from the RF-port is 20 dB below the LO energy incident at the LO-port, and the isolation is said to be 20 dB. This indicates significant leakage in the mixing node.

Figure 6:
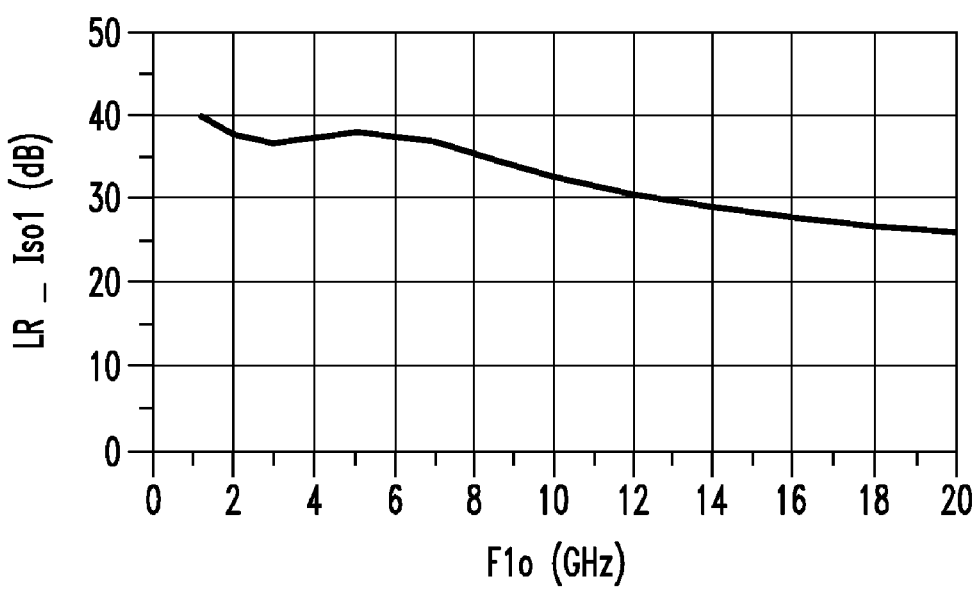
FIG. 6 is a graph illustrating energy loss characteristics of a mixer, according to a representative embodiment.

In comparison, FIG. 6 is a graph illustrating energy lost in a mixer, according to a representative embodiment, from an RF-port due to LO leakage in the mixing node. For example, FIG. 6 may indicate energy lost from the mixer 400 depicted in FIG. 4. The vertical axis of FIG. 6 shows isolation of the LO-port (e.g., LO-port 410) from the RF-port (RF-port 420) in dB and the horizontal axis shows the frequency of the LO signal input through the LO-port in GHz.

The curve of FIG. 6 shows less loss of LO energy through the RF-port as the frequency of the LO signal increases, as compared to the curve illustrated in FIG. 5. For example when the frequency of the LO signal is 13 GHz, the energy output from the RF-port is about 30 dB below the LO energy incident at the LO-port, and the isolation is said to be 30 dB. There is therefore a 10 dB improvement in isolation at 13 GHz, relative to the isolation shown in the graph of FIG. 5. This indicates substantially less leakage in the mixing node, which is due to the leakage cancellation (e.g., by FETs 412 and 413) with respect to the balanced input signals. Accordingly, the curve of FIG. 6 likewise shows that the isolation of LO-port 410 from RF-port 420 has increased.

In alternative embodiments, the mixer (e.g., mixer 400) may function as an up-converter. In such embodiments, the input signal is the IF signal and the signal that emerges from the RF port is the output signal. The output signal thus may be a sum frequency or a difference frequency, e.g., Frequency (LO)+Frequency (IF) or Frequency (LO)−Frequency (IF).

Further, the various embodiments likewise provide the same degree of improvement with respect to leakage from the LO-port (e.g., LO-port 410) to the IF-port (IF-port 430). Typically, though, IF-port leakage is less of a concern because in down converter applications, the IF-port is treated with a low pass filter (e.g., as part of the diplexer), which substantially rejects LO leakage.

In view of this disclosure it is noted that variant mixers can be implemented in keeping with the present teachings. Further, the various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A mixer, comprising:
 a first transistor comprising a gate operative to receive a first signal of a balanced local oscillator (LO) signal, a first source/drain coupled to ground, and a second source/drain; and
 a second transistor comprising a gate operative to receive a second signal of the balanced LO signal, a first source/drain that is floating, and a second source/drain connected to the second source/drain of the first transistor forming a mixing node, leakage of LO energy from the second transistor substantially cancelling leakage of LO energy from the first transistor.

2. The mixer of claim 1, wherein the second signal is out of phase with the first signal.

3. The mixer of claim 2, wherein the second signal is 180 degrees out of phase with the first signal.

4. The mixer of claim 1, wherein the balanced LO signal is output from an LO-port.

5. The mixer of claim 1, wherein the balanced LO signal is output from a balun, which receives an unbalanced LO signal from an LO-port.

6. The mixer of claim 1, further comprising:
 a diplexer connected to the mixing node formed by the connected second sources/drains of the first transistor and the second transistor.

7. The mixer of claim 6, wherein the diplexer comprises a capacitor connected to a radio frequency (RF) port and an inductor connected to an intermediate frequency (IF) port.

8. The mixer of claim 7, wherein the substantially cancelled leakage of LO energy increases an isolation of the LO-port from the RF-port.

9. The mixer of claim 1, the first transistor comprises a first field effect transistor and the second transistor comprises a second field effect transistor, the first field effect transistor having a substantially greater total gate width than the second field effect transistor.

10. A mixer, comprising:
 a balun connected to a local oscillator (LO) port of the mixer;
 a first transistor comprising a first gate coupled to a first output of the balun and a first source coupled to a ground voltage; and
 a second transistor comprising a second gate coupled to a second output of the balun and a floating second source for increasing isolation of the LO-port to a diplexer of the mixer,
 wherein the diplexer is connected to an intermediate frequency (IF) port and a radio frequency (RF) port.

11. The mixer of claim 10, wherein the first transistor further comprises a first drain and the second transistor further comprises a second drain, the first and second drains connecting to form a mixing node connected to the diplexer.

12. The mixer of claim 11, wherein the balun receives an unbalanced LO signal and outputs a balanced LO signal, comprising a first signal applied to the first gate of the first transistor and a second signal applied to the second gate of the second transistor.

13. The mixer of claim 12, wherein the second signal is out of phase with respect to the first signal.

14. The mixer of claim 13, wherein the first source introduces first LO leakage from the first signal into the mixing node and the floating second source introduces second LO leakage from the second signal into the mixing node, the second LO leakage substantially canceling the first LO leakage.

15. The mixer of claim 14, wherein an amplitude of the first LO leakage is matched to an amplitude of the second LO leakage.

16. The mixer of claim 10, wherein each of the first and second transistors comprises a field effect transistor (FET).

17. The mixer of claim 16, the first transistor comprises a 60 um FET and the second transistor comprises a 24 um FET.

18. The mixer of claim 10, wherein increasing the isolation of the LO-port to the diplexer reduces energy leaking from the RF-port.

19. A mixer, comprising:

a first field effect transistor (FET) comprising a gate that receives a first signal of a balanced local oscillator (LO) signal, a first source/drain coupled to a ground voltage, and a second source/drain;

a second FET comprising a second gate that receives a second signal of the balanced LO signal, a first source/drain that floats, and a second source/drain connected to the second source/drain of the first FET to form a mixing node, the second signal having a phase opposite to a phase of the first signal; and a diplexer connected between the mixing node and each of a radio frequency (RF) port and an intermediate frequency (IF) port, wherein a first LO leakage caused by the first FET is substantially canceled by a second LO leakage caused by the second FET at the mixing node.

* * * * *